United States Patent [19]

Rapoport

[11] Patent Number: 5,162,734
[45] Date of Patent: Nov. 10, 1992

[54] METHOD AND APPARATUS FOR OBTAINING AN NMR SIGNAL HAVING A PRESELECTED FREQUENCY DOMAIN

[75] Inventor: Uri Rapoport, Oak Park, Ill.

[73] Assignee: Elbit-ATI, Ltd., Oak Park, Ill.

[21] Appl. No.: 666,259

[22] Filed: Mar. 8, 1991

[51] Int. Cl.⁵ .............................................. G01R 33/20
[52] U.S. Cl. .................................... 324/307; 324/300; 324/312
[58] Field of Search ................ 324/300, 307, 308, 309, 324/310, 312, 314; 364/498

[56] References Cited

U.S. PATENT DOCUMENTS

| | | | |
|---|---|---|---|
| 4,680,546 | 7/1987 | DuMoulin | 324/300 |
| 4,719,582 | 1/1988 | Ishida et al. | 364/498 |
| 4,912,050 | 3/1990 | Fossel | 324/309 |
| 4,947,119 | 8/1990 | Ugurbil et al. | 324/307 |
| 5,041,787 | 8/1991 | Luyten | 324/309 |

Primary Examiner—Louis Arana
Attorney, Agent, or Firm—Jones, Day, Reavis & Pogue

[57] ABSTRACT

A nuclear magnetic resonance device in which a test sample can be excited with selective pulses of electromagnetic energy so as to cause the generation of a frequency domain spectrum signal that includes only preselected blocks of information.

16 Claims, 3 Drawing Sheets

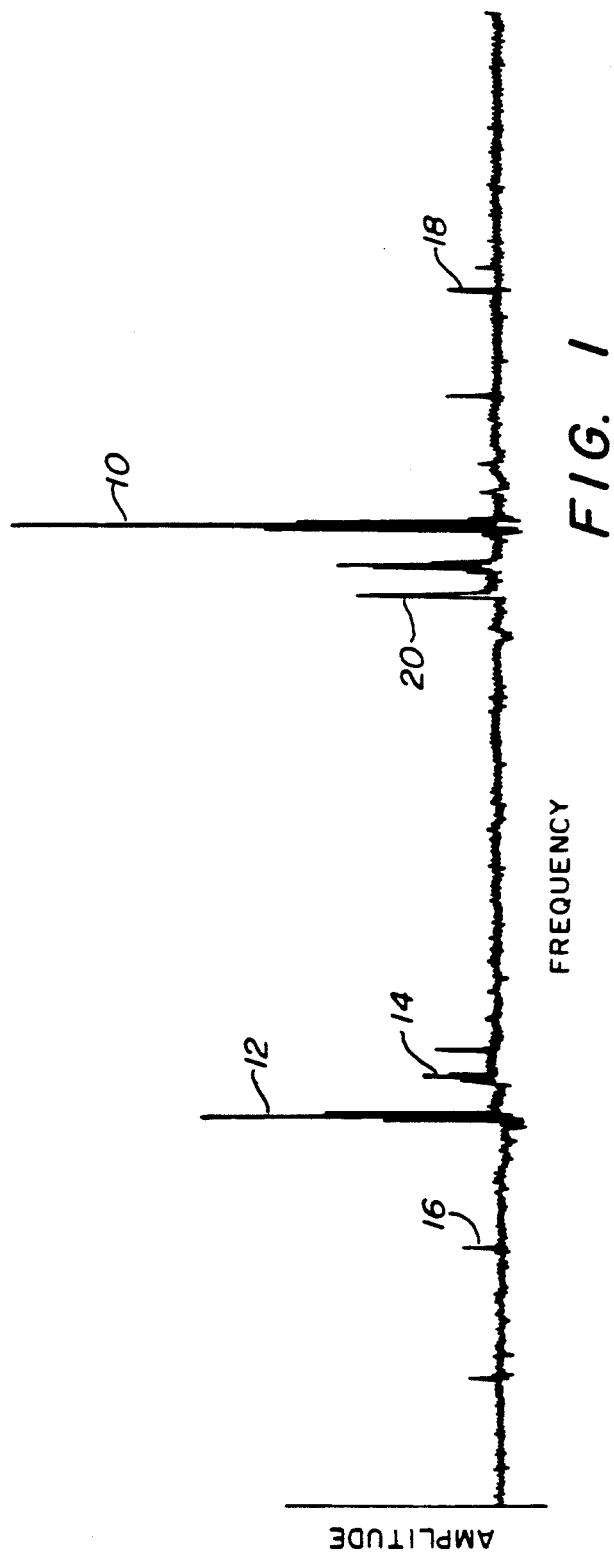
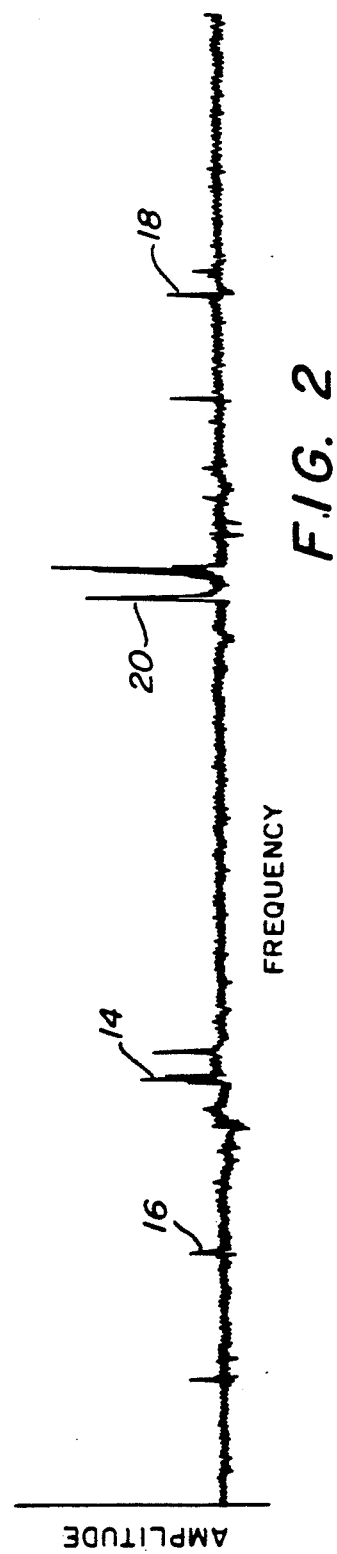

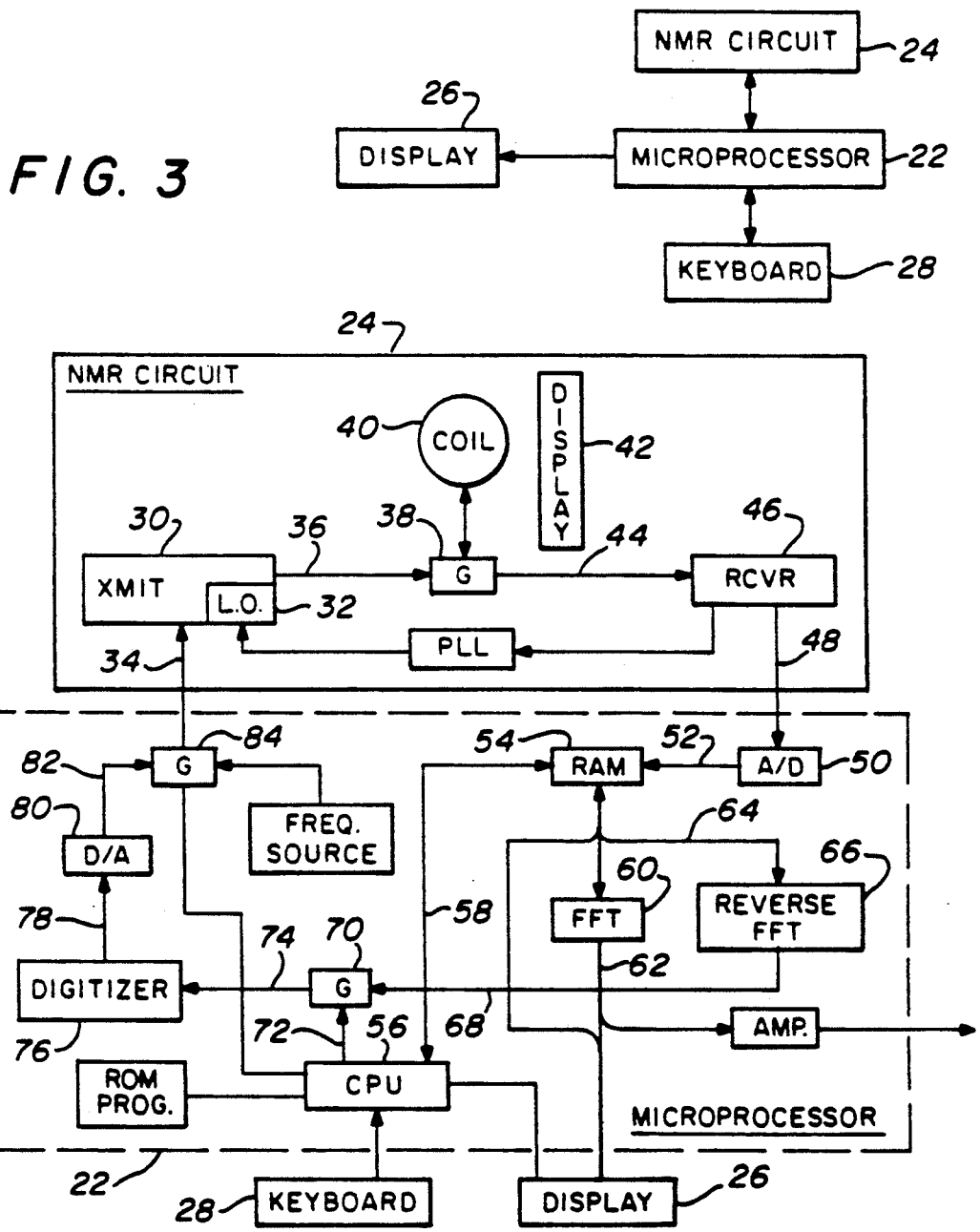
FIG. 3
FIG. 4
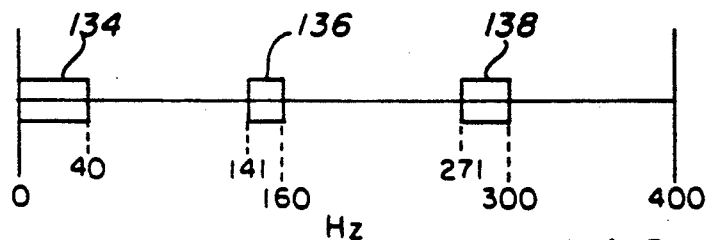
FIG. 6

METHOD AND APPARATUS FOR OBTAINING AN NMR SIGNAL HAVING A PRESELECTED FREQUENCY DOMAIN

FIELD OF THE INVENTION

The present invention relates generally to NMR devices and in particular to an NMR device in which a test sample can be excited with selective pulses of, electromagnetic energy so as to cause the generation of a frequency domain spectrum that has only preselected blocks of information thereon.

BACKGROUND OF THE INVENTION

The development of nuclear magnetic resonance (NMR) spectroscopy for biological diagnostics was a discovery welcomed by those who analyze living systems. An extensive discussion of the NMR techniques and application to living systems may be found in commonly assigned co-pending applications Ser. No. 90,400, filed Sep. 4, 1986, now U.S. Pat. No. 4,839,352 and Ser. No. 106,114, filed Oct. 7, 1987, now U.S. Pat. No. 4,998,976 all of which are incorporated herein by reference as if set forth herein fully.

It is understood that techniques for NMR spectroscopy rely upon identifying characteristic concentrations and distributions of protons in a test sample. The sample is subjected to pulses of electromagnetic energy while the sample is positioned within a uniform magnetic field. A typical such pulse used to analyze protons is at 50MHz for 10 microseconds, although frequencies and pulse widths will vary. Data characteristics of the proton population received while the sample is under the influence of the magnetic field yield valuable information about living systems. Sensors are provided for sensing the rates of relaxation or energy release of the protons and generating a signal in the time domain commonly called the free induction decay (FID) signal. This signal can be analyzed with a Fourier transform to develop a spectrum of signals in the frequency domain. Analytical means must then be provided for receiving and analyzing the signals emitted, discriminating between various peaks, comparing the amplitude or height of various peaks, and/or normalizing the analysis by reference to a standard sample so as to obtain the concentration of constituents in the tested materials. It has been found that the characteristic resonant frequency of a nucleus depends to a very small, but measurable, extent upon its chemical environment. It is found, for instance, that the protons of water do not absorb at quite the same frequency as those of mineral oil, the difference being only a few parts per million.

Thus, a number of different signals may be obtained in one NMR reading. It is imperative that the NMR signals in question be strong enough to yield signals above the receiver noise and narrow enough to be distinguishable from one another. Various operations are used to better the signal-to-noise ratios. Such improvement can be obtained by signal averaging techniques such that with the accumulation of N-scans, the net increase of the S/N conditions will be N since the noise is random. Thus, if four data averagings are performed, the S/N ratio will increase by a factor of 2.

While the proton is the most sensitive nucleus to excite, it is also the most abundant and therefore yields more complex spectra and additionally yields a large solvent peak in aqueous solutions. Such a large peak makes it difficult to observe weaker signals within the sample. When the FID time domain signal has been transformed by the Fourier analysis into a frequency domain signal, the frequency spectrum designating, for example, the water as a peak may yield a very large peak. When the signals are run through an amplifier, the large water peak saturates the amplifier and the smaller signals cannot be properly analyzed.

There have been a number of systems in an attempt to eliminate the effect of the water peak. One is known as WEFT and the acronym stands for Water Eliminated Fourier Transform NMR Spectroscopy. This method is based on the inversion-recovery technique for the measurement of the well-known spin-lattice relaxation time, $T_1$. The technique involves the inversion of the magnetization, in some cases both the solvent and solute resonances, by a 180° pulse followed after an interval $\tau$ by a 90° sampling pulse to measure the regrowth of the magnetization toward equilibrium. It is known that when $\tau = 0.693 T_1$ (solvent), the recovering solvent magnetization passes through zero. If the solute $T_1$ is substantially shorter than that of the solvent, a 90° pulse at this time, followed by the acquisition of the signal, will provide a spectrum of the solute without that of the solvent. After an interval of $5T_1$ (solvent), the pulse sequence may be repeated. It is possible to suppress the solvent resonance 1000-fold with this method.

Another method that is frequently employed for the selective excitation of solute resonances without exciting the solvent is the Redfield "2-1-4" pulse. In this case, the interval from the center of a function to the first null corresponding to the difference between the transmitter frequency and the solvent frequency is given by $1/\tau$, the reciprocal of the pulse width $\tau$. If, for example, $\tau$ is 500 microseconds (a rather long or "soft" pulse), this frequency is 2000Hz. A nucleus resonating at 2000Hz from the transmitter frequency will not experience any net flipping by the RF field and so will not appear in the spectrum. Because a square wave pulse in the form of $$\frac{\sin x}{x}$$

is a function that crosses the null very abruptly, effective suppression of a solvent resonance requires careful adjustment of the transmitter frequency and the pulse width.

Other techniques are used to attempt to suppress solvent peaks. However, with all of these techniques, solute resonances at or near the solvent resonance will also inevitably be suppressed. Further, the techniques are complicated and difficult to perform and require exacting adjustments in order to achieve effective suppression.

The present invention overcomes the disadvantages of the prior art by providing an apparatus and method for suppressing any unwanted characteristic resonance in a preselected manner. It is well known that when the FID time domain signal is generated by the NMR circuit, a fast Fourier transform (FFT) of the FID signal results in a frequency domain spectrum illustrating the peaks having varying amplitudes for the various constituents in the sample. In such cases, as explained previously, one of the peaks will be much stronger than the other peaks and, for example, in a sample with a water solvent, the peak representing the water solvent is usually very strong and overshadows all of the other peaks. If it is desired to remove this peak, shown in the time domain spectrum on a display system, an operator using a keyboard and a microprocessor simply designates the portion or portions of the frequency domain spectrum that are to be eliminated. Since the microprocessor memory stores in digital form the data that is being displayed as the frequency domain spectrum, it is relatively simple for the microcomputer to delete from the displayed frequency domain spectrum those frequencies that one desires to eliminate. Thus, the resulting frequency domain spectrum displayed is a desired spectrum, not the actual spectrum.

This desired frequency domain spectrum is then operated on by a reverse fast Fourier transform function to generate an FID signal in the time domain that would represent such a desired frequency domain signal before the FFT transform. This FID signal is then digitized and converted into an analog signal which is used to pulse the sample under test with a typical NMR device. A new FID time domain signal is obtained and passed through a fast Fourier transform device to transform the time domain signal into a frequency domain signal. The frequency domain signal will not have the peaks that were previously selected for removal. Thus, the remaining peaks can be passed through linear amplifiers as necessary to obtain further analysis of those signals.

Further, instead of eliminating just one particular frequency in the frequency domain spectra, blocks of frequencies may be removed. For instance, if the frequency domain spectrum has a width of 400Hz, one could elect to eliminate the area including the first 40Hz, the eighth 20Hz block, and the tenth 30Hz block. If the frequency domain spectrum extended from Hz to 400Hz, for example, one could delete a block of data from Hz to 40Hz, a second block of data from 141Hz to 160Hz, and a third block of data from 271Hz to 300Hz. Clearly, any other one block or multiple blocks of data could be eliminated from the frequency domain spectrum in this manner. Using this procedure, the high peaks in frequency domain spectra can be eliminated thus allowing the smaller peaks to be passed through a linear amplifier to obtain more precise information and better analysis.

Thus, it is the preferred object of the present to generate an NMR signal having a preselected frequency domain spectrum for constituents in a given sample.

It is another object of the present invention to modify an existing frequency domain spectrum into a desired frequency domain spectrum, converting the desired spectrum to analog signals, and pulsing an NMR device with the analog signals to obtain an FID signal which, when transformed into a frequency domain signal, eliminates preselected, undesired solvent peaks.

It is also an object of the present invention to generate a frequency spectrum representing the constituents in a test sample, removing from the frequency domain spectrum predetermined blocks of frequencies which are undesirable, performing a reverse FFT transform on the modified frequency domain spectra to obtain a new FID signal, digitizing the FID signal, changing the digitized signal to an analog signal, pulsing the test sample with the modified signal to obtain a new FID signal, and performing a fast Fourier transform on the newly obtained FID signal to obtain the desired frequency domain spectra having the undesirable frequencies eliminated.

SUMMARY OF THE INVENTION

Thus, the present invention relates to apparatus for obtaining an NMR signal having a preselected frequency domain spectrum for constituents in a given sample comprising means for pulsing the sample to generate a first time domain FID signal for the given sample, means coupled to the FID signal generating means for transforming the time domain FID signal into the corresponding frequency domain signal spectrum having peaks that vary in amplitude and frequency to represent the sample constituents, means for receiving the frequency domain signal spectrum and removing at least one selected frequency peak from the spectrum to obtain a desired frequency domain spectrum, means for converting the desired frequency domain spectrum into a corresponding second time domain FID signal, means for using the second time domain FID signal to generate analog signals for pulsing the sample and generating a third FID time domain signal, and means for converting the third time domain signal into a frequency domain spectrum having the at least one selected frequency peak eliminated.

The invention also relates to a method for obtain an NMR signal having a preselected frequency domain spectrum for constituents in a given sample under test comprising the steps of generating a time domain signal with an NMR device, converting the time domain signal to a frequency domain signal having peaks that represent constituents in the test sample, eliminating at least one constituent peak from the frequency domain signal to obtain a desired frequency domain signal, converting the desired frequency domain signal to an analog signal for pulsing the NMR device to generate a second time domain signal, and converting the second time domain signal to a frequency domain signal having the at least one constituent peak eliminated.

BRIEF DESCRIPTION OF THE DRAWINGS

These and other objects of the present invention will be more fully understood in conjunction with the accompanying drawings in which like numbers indicate like components and in which:

FIG. 1 is a diagram of a typical frequency domain signal that illustrates a frequency domain signal spectrum obtained with an NMR system having peaks that vary in amplitude and frequency to represent the constituents in a sample under test;

FIG. 2 is a diagram of a frequency domain signal spectrum as shown in FIG. 1 with peaks at selected frequencies removed with the device of the present invention;

FIG. 3 is a general block diagram of the present invention;

FIG. 4 is a detailed block diagram of the present invention;

FIG. 6 is a graph illustrating the capabilities of the present invention in removing selected frequency peaks from a frequency domain spectrum.

DETAILED DESCRIPTION

Figure 5:
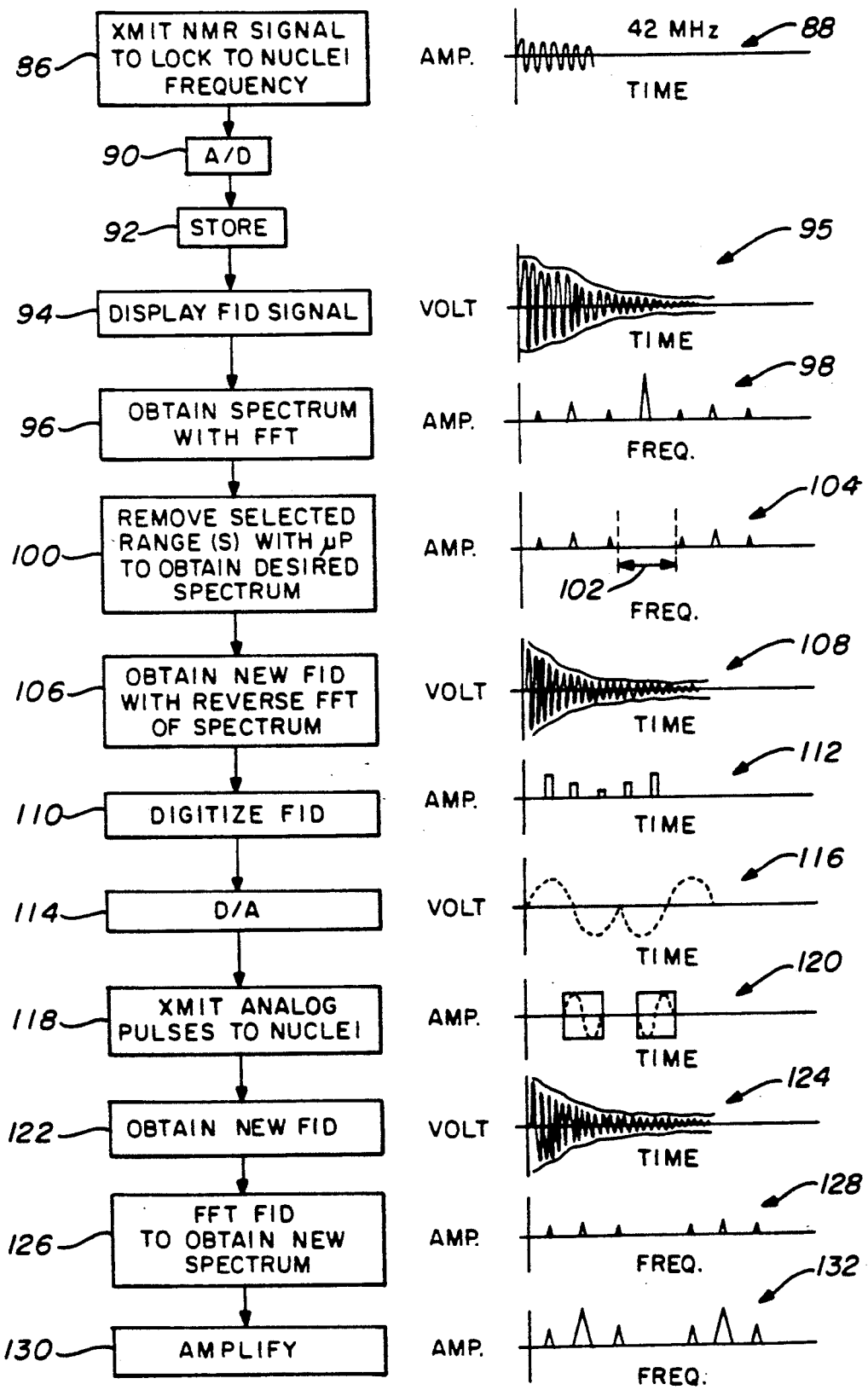
FIG. 5 is a flow chart illustrating the novel steps of the present invention to obtain a frequency domain spectrum having at least one selected frequency peak eliminated.

It is well known in the nuclear magnetic resonance (NMR) art that a free induction decay signal (FID) is obtained when the nuclei of a test sample is excited at the proper frequency. The FID signal is in the time domain and, as well known in the art, when subjected to the fast Fourier transform function, is converted into a frequency domain signal spectrum as illustrated in FIG. 1 wherein peaks vary in amplitude and frequency to represent the constituents in the sample under test. Thus, FIG. 1 illustrates a graph of amplitude versus frequency. If it is assumed, for example only, that the graph represents the results of exciting protons in the sample under test, because they are the most abundant, it yields a more complex spectrum and additionally yields a large solvent peak in aqueous solutions. Such a peak may be peak 10, for example, in FIG. 1. The abundant constituents may generate another large peak 12 which, although it is not as large as peak 10 is much greater than the other peaks in the spectrum. Such large peaks as peaks 10 and 12 make it difficult to observe the weaker signals, 14, 16, 18, and 20, for example. When the FID time domain signal has been transformed by the Fourier analysis into the frequency domain signal shown in FIG. 1, the frequency producing peak 10, for example, may designate the water and of course is the largest peak in FIG. 1. When the signals are run through an amplifier, the large water peak 10 saturates the amplifier and the smaller signals cannot be properly analyzed.

The present invention enables the frequency domain signal of FIG. 1 to be modified as illustrated in FIG. 2 to remove the large peaks 10 and 12. The remaining signals can be coupled to an amplifier and expanded so that signals 16, 14, 18 and 20, for example, can be properly analyzed. With the present invention, any one or more of the signals can be removed to enable proper analysis of any one of the remaining signals.

The general block diagram of the present invention is disclosed in FIG. 3 in which a microprocessor 22 is coupled to an NMR circuit 24 which operates in a conventional manner to produce an FID signal that is operated on by the microprocessor with a Fourier transform to generate the frequency domain signal. The frequency domain signal may be viewed on display 26. By appropriate use of the keyboard 28, the microprocessor can be instructed to remove from its memories that data representing the peaks that need to be adjusted or eliminated from the frequency domain signal. The NMR circuit 24 is a typical NMR circuit. In the circuit 24 is included the probe or other assembly for positioning the test sample in a magnetic field. The microprocessor 22 enables a timing device to send out precisely timed digital signals to a transmitter. The RF transmitter superimposes a signal of the correct frequency on the digital signals from the microprocessor. These RF pulses are amplified and sent to the sample probe that is tuned to absorb the RF pulse. Transitions are excited between the nuclear spin energy levels in the sample under test. The nuclei then undergo a free induction decay as equilibrium is re-established. Because the signal is very weak, in the order of nanovolts, a preamplifier amplifies the weak signal and that signal is then converted to an audio signal through IF mixers. The audio signal is sent through a filter and converted to a digital signal. Because the signals are digitized, they can be stored in the microprocessor 22 for further processing including the fast Fourier transformation, and the selective removal of frequency peaks from the frequency domain signal as will be described hereafter.

FIG. 3 is a detailed block diagram of the present invention. The NMR device 24, shown generally in FIG. 4, includes a transmitter 30 that has within it a local oscillator 32. The microprocessor 22 generates a signal on line 34 that causes pulses to be transmitted from transmitter 30 on line 36 at the proper frequency. These pulsed RF signals are coupled through gate 38 to coil 40 which excites the nuclei in the sample 42 in a well-known manner. Coil 40 detects the energy produced by the excited nuclei in the sample 42 and couples that signal through gate 38 on line 44 to receiver 46. Receiver 46 generates a free induction decay signal on line 48 that is well known in the art. The FID signal on line 48 is a time domain signal that is coupled to analog-to-digital converter 50 in the microprocessor 22. The digitized output of the A-to-D converter 50 on line 52 is still a time domain signal that is digitized and stored in RAM 54 of microprocessor 22. The central processing unit 56 generates a signal on line 58 to the RAM 54 to connect the stored data to fast Fourier transform function 60 to produce a frequency domain output signal on line 62. This signal is a frequency domain spectrum such as illustrated in FIGS. 1 and 2 and is displayed on display 26.

In order to modify the frequency domain signal in FIG. 1 to that of FIG. 2, the operator utilizes keyboard 28 to instruct CPU 56 to delete from memory the stored portions of the signals 10 and 12 in FIG. 1. The resulting signal is again stored in RAM 54 and coupled on line 64 to reverse fast Fourier transform function 66 which generates an output on line 68 that is a time domain signal equivalent to a free induction decay signal necessary to generate the desired frequency domain signal shown in FIG. 2. This signal on line 68 is coupled through gate 70 which is opened by the CPU 56 with a signal on line 72 and the output of gate 70 on line 74 is coupled to digitizer 76 where the signal is digitized. The digitized output on line 78 is coupled to digital-to-analog converter 80 where the signal is transformed into an analog signal. The analog signal on line 82 is coupled by the CPU 56 through gate 60 on line 34 to the transmitter where it is used to pulse coil 40 to excite the sample 42. The FID signal recovered from receiver 46 on line 48 is again digitized by the A-to-D converter 50 and coupled to RAM 54 on line 52 for storage. By causing the fast Fourier transform function 60 to operate on the new digitized FID signal, the frequency domain signal on line 62 to the display will be that shown in FIG. 2.

Thus, in essence, the desired frequency domain signal is operated on by a reverse fast Fourier transform to generate the free induction decay signal which would cause such a frequency domain signal. That transformed frequency induction decay signal is digitized and then converted to an analog signal which is used to pulse the sample under test. That pulse will cause an FID signal to be generated which when operated on by the fast Fourier transform will generate the frequency domain signal desired having the selected peaks eliminated.

The steps of the novel invention are illustrated in FIG. 5. At step 86, the NMR signal is transmitted to lock to the nuclei frequency. A graph 88 of the NMR pulse is illustrated adjacent step 86. The received FID signal is digitized in the analog-to-digital converter at step 90 and the digitized signal is stored in the RAM at step 92. At step 94, the FID signal may be displayed as illustrated in the graph 96. The microprocessor at step 96 causes the stored FID signal in the RAM 54 to pass through the fast Fourier transform function 60 to generate the frequency domain signal illustrated in graph 98.

In step 100, the operator, using keyboard 28 may remove a band of frequencies 102 shown on the display as illustrated in graph 104. This new frequency domain signal is passed through the reverse fast Fourier transform function 66 to obtain a new FID signal at step 106 that has the graph illustrated at 108. At step 110, the FID signal is digitized to generate the signals shown in graph 112. At step 114, the signals are converted to analog signals as illustrated in graph 116. At step 118, the analog signals are used to pulse the nuclei with the transmitter 30 with pulses as illustrated in graph 120. At step 122, the new FID is obtained as illustrated in graph 124 and is passed through the fast Fourier transform function 60 at step 126 to obtain the new frequency domain signal as illustrated in graph 128. At step 130, an amplifier is used to amplify the signals to obtain the signal illustrated in graph 132. Thus, the signal in graph 132 has at least one selected frequency peak eliminated by this procedure.

Clearly, as illustrated in the graph of FIG. 6, a 400Hz frequency domain spectrum may have selected blocks 134, 136 and 138 to be selectively eliminated to eliminate various peaks of different frequencies. Thus, as illustrated in FIG. 6, a block 134 extending from 0Hz to 40Hz could be selected to be eliminated. In addition, a block 136 from 141Hz to 160Hz could be selected to be eliminated. Finally, a block from 271Hz to 300Hz could also be selected to be eliminated. It is to be understood, of course, that these blocks are merely representative and one or more of them in different frequency ranges could be selected for elimination by this system.

Thus, there has been disclosed a method and apparatus for suppressing any unwanted characteristic resonance in a frequency domain NMR signal in a preselected manner. The FID time domain signal generated by the NMR circuit is passed through a fast Fourier transform resulting in a frequency domain spectrum having peaks with varying amplitudes representing the various constituents in the sample. If it is desired to remove selected peaks from the frequency domain spectrum, an operator using a keyboard or other input device and a microprocessor simply designates the portion or portions of the frequency domain spectrum that are to be eliminated. The microprocessor stores the data in digital form in its memory and it is therefore relatively simple for the microcomputer to delete from the displayed frequency domain spectrum certain frequencies as desired by the operator. Thus, the resulting frequency domain displayed is the desired spectrum. This desired spectrum is then operated on by a reverse fast Fourier transform function to generate an FID signal in the time domain that would represent such a desired frequency domain signal before the fast Fourier transform. This signal is digitized and converted into an analog signal which is used to pulse the sample under test with a typical NMR device. A new FID time domain signal is obtained and passed through a fast Fourier transform device to transform the time domain signal into a new frequency domain signal. This new frequency domain signal will not have the peaks that were previously selected for removal. The remaining peaks can be passed through linear amplifiers or processed as necessary to obtain further analysis of those signals.

The foregoing specification describes only the embodiments of the invention shown and/or described. Other embodiments may be articulated as well. The terms and expressions used, therefore, serve only to describe the invention by example and not to limit the invention. It is expected that others will perceive differences which, while different from the foregoing, do not depart from the scope of the invention herein described and claimed. In particular, any of the specific constructional elements described may be replaced . other know element having equivalent function.

I claim:

1. Apparatus for obtaining an NMR signal having a preselected frequency domain spectrum for constituents in a given test sample comprising:

means for pulsing said sample and generating a first time domain FID signal for said given sample;

means coupled to said first FID signal generating means for converting the first time domain FID signal into a corresponding frequency domain signal spectrum having peaks that vary in amplitude and frequency to represent the sample constituents;

means for receiving the said frequency domain signal spectrum and removing at least one selected frequency peak from said spectrum to obtain a desired frequency domain spectrum;

means for converting the desired frequency domain spectrum into a corresponding second time domain FID signal;

means for using the second time domain FID signal to generate analog signals for pulsing said sample and generating a third time domain FID signal; and said means for converting the first time domain FID signal into a frequency domain spectrum being used to convert the third time domain FID signal into a frequency domain signal having the at least one selected frequency peak eliminated.

2. Apparatus as in claim 1 wherein said means for pulsing said sample and generating said first time domain FID signal comprises:

a transmitter including a local oscillator for generating a frequency for exciting the nuclei of said given sample with a predetermined frequency to generate the resonant frequency of said nuclei; and an RF receiver coupled to said transmitter and receiving said resonant frequency for comparing said resonant frequency with said local oscillator frequency to obtain said first free induction decay signal.

3. Apparatus as in claim 2 wherein said means for transforming said first and third time domain frequency free induction decay signals into their corresponding frequency domain signal spectrum comprises a fast Fourier transform function for operating on said first and third time domain free induction decay signals and generating a corresponding frequency domain spectrum as an output signal.

4. Apparatus as in claim 3 wherein said means for removing said at least one frequency peak from said frequency domain signal spectrum comprises:

a microprocessor including said fast Fourier transform function, said microprocessor having a memory for storing said generated frequency domain spectrum;

a display device coupled to said microprocessor for displaying said generated frequency domain spectrum; and input means coupled to said microprocessor for generating instructions to said microprocessor to remove said at least one of said frequency peaks from said frequency domain spectrum stored in said memory.

5. Apparatus as in claim 4 wherein said means for converting the desired frequency domain spectrum into a corresponding second time domain free induction decay signal comprises a reverse fast Fourier transform function coupled to said microprocessor memory for receiving said desired frequency domain spectrum and converting said desired frequency domain signal into its corresponding second time domain free induction decay signal.

6. Apparatus as in claim 5 wherein said means for using the second time domain free induction decay signal to generate analog signals for pulsing said sample and generating said free induction decay third time domain signal comprises:
   means for digitizing said second time domain free induction decay signal;
   means for converting said digitized free induction decay signal to an analog signal; and
   means for coupling said analog signal to said transmitter for pulsing said test sample and generating said third time domain free induction decay signal.

7. Apparatus as in claim 6 wherein said means for converting said third time domain free induction decay signal into a frequency domain signal comprise said fast Fourier transform function.

8. A nuclear magnetic resonance device for obtaining a signal having a preselected frequency domain spectrum for constituents in a given sample under test comprising:
   means for generating a time domain signal with the nuclear magnetic resonance device;
   means for converting the time domain signal to a frequency domain signal having peaks that represent constituents in the test sample;
   means for eliminating at least one constituent peak from said frequency domain signal to obtain a desired frequency domain signal;
   means for converting said desired frequency domain signal to an analog signal for pulsing the nuclear magnetic resonance device to generate a second time domain signal; and
   means for converting the second time domain signal to a frequency domain signal having the at least one constituent peak eliminated.

9. A method for obtaining a nuclear magnetic resonant signal having a preselected frequency domain spectrum for constituents in a given test sample comprising the steps of:
   pulsing said sample and generating a first time domain free induction decay signal for said given sample;
   transforming the first time domain free induction decay signal into a corresponding frequency domain signal spectrum having peaks that vary in amplitude and frequency to represent said sample constituents;
   removing at least one selected frequency peak from said frequency domain signal spectrum to obtain a desired frequency domain spectrum;
   converting the desired frequency domain spectrum into a corresponding second time domain free induction decay signal;
   using the second time domain free induction decay signal to generate analog signals for pulsing said test sample and generating a third free induction decay time domain signal; and
   converting the third time domain signal into a frequency domain spectrum having the at least one selected frequency peak eliminated.

10. A method as in claim 9 wherein the step of generating said first time domain free induction decay signal further comprises the steps of:
    exciting the nuclei of said given sample with a predetermined frequency from a transmitter, including a local oscillator, to generate the resonant frequency of said nuclei; and
    comparing said resonant frequency with said local oscillator frequency to obtain said first free induction decay signal.

11. A method as in claim 10 wherein the step of transforming said time domain free induction decay signal into its corresponding frequency domain signal spectrum further comprises the step of transforming said first free induction decay signal into a corresponding frequency domain spectrum as an output signal with a fast Fourier transform function.

12. A method as in claim 11 wherein the step of removing said at least one frequency peak from said frequency domain signal spectrum further comprises the steps of:
    enabling a microprocessor to operate said fast Fourier transform function, said microprocessor having a memory for storing said generated frequency domain spectrum;
    coupling a display device to said microprocessor for displaying said generated frequency domain spectrum; and
    coupling input means to said microprocessor for generating instructions to said microprocessor to remove said at least one of said frequency peaks from said frequency domain spectrum stored in said memory.

13. A method as in claim 12 wherein the step of converting the desired frequency domain spectrum into a corresponding second time domain free induction decay signal comprises the step of enabling said microprocessor to perform a reverse fast Fourier transform function on said desired frequency domain spectrum stored in said memory and converting said desired frequency domain spectrum into its corresponding second time domain free induction decay signal.

14. A method as in claim 13 wherein the step of using the second time domain free induction decay signal to generate analog signals for pulsing said test sample and generating said third free induction decay time domain signal further comprises the steps of:
    digitizing said second time domain free induction decay signal;
    converting said digitized free induction decay signal to an analog signal; and
    coupling said analog signal to said transmitter for pulsing said test sample and generating said third time domain free induction decay signal.

15. A method as in claim 14 wherein the step of converting said third time domain free induction decay signal into a frequency domain signal comprises the step of performing a fast Fourier transform on said third time domain free induction decay signal.

16. A method for obtaining a nuclear magnetic resonant signal having a preselected frequency domain spectrum for constituents in a given sample under test comprising the steps of:
    generating a time domain signal with a nuclear magnetic resonance device;
    converting the time domain signal to a frequency domain signal having peaks that represent constituents in the test sample;

eliminating at least one constituent peak from said frequency domain signal to obtain a desired frequency domain signal;

converting said desired frequency domain signal to an analog signal for pulsing said nuclear magnetic resonance device to generate a second time domain signal; and converting the second time domain signal to a frequency domain signal having the at least one constituent peak eliminated.

* * * * *